(12) United States Patent
Huang

(10) Patent No.: US 7,242,068 B2
(45) Date of Patent: Jul. 10, 2007

(54) PHOTOSENSITIVE SEMICONDUCTOR PACKAGE, METHOD FOR FABRICATING THE SAME, AND LEAD FRAME THEREOF

(75) Inventor: Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 74 days.

(21) Appl. No.: 10/953,915

(22) Filed: Sep. 28, 2004

(65) Prior Publication Data
US 2005/0133878 A1    Jun. 23, 2005

(30) Foreign Application Priority Data
Dec. 23, 2003   (TW) .............................. 92136488 A

(51) Int. Cl.
H01L 31/0203   (2006.01)
H01L 23/495    (2006.01)
(52) U.S. Cl. ..................... 257/433; 257/434; 257/676; 257/680
(58) Field of Classification Search ................ 257/433, 257/434, 676, 680, 690, 692, 704
See application file for complete search history.

(56) References Cited

U.S. PATENT DOCUMENTS 6,384,472 B1   5/2002   Huang
6,545,332 B2   4/2003   Huang

*Primary Examiner*—Hung Vu
(74) *Attorney, Agent, or Firm*—Peter F. Corless; Steven M. Jensen; Edwards Angell Palmer & Dodge LLP

(57) ABSTRACT

A photosensitive semiconductor package, a method for fabricating the same, and a lead frame thereof are proposed. The lead frame has a die pad and a plurality of leads, wherein at least one recessed portion is formed at an end of each lead close to the die pad, and at least one recessed region is formed on the die pad. An encapsulant fills the recessed portions, the recessed region, and between the leads and the die pad, and is formed on the lead frame to define a chip receiving cavity. A photosensitive chip is mounted in the chip receiving cavity, wherein at least partially a non-active surface of the chip is attached to the encapsulant filling the recessed region and is not in contact with the recessed region. A light-penetrable unit is attached to the encapsulant formed on the lead frame to seal the chip receiving cavity.

14 Claims, 10 Drawing Sheets

PHOTOSENSITIVE SEMICONDUCTOR PACKAGE, METHOD FOR FABRICATING THE SAME, AND LEAD FRAME THEREOF

FIELD OF THE INVENTION

The present invention relates to photosensitive semiconductor packages, methods for fabricating the same and lead frames thereof, and more particularly, to a photosensitive semiconductor package for use with an image sensor and having high mechanical strength, a method for fabricating the semiconductor package, and a lead frame of the semiconductor package.

BACKGROUND OF THE INVENTION

Along with the advancement in the electronic industry and development of the digital times, electronic products have be developed toward having integrated functions, so as to allow various products to be incorporated into a single electronic device, thereby providing convenience in usage for users and eliminating the spatial limitation. For example, a variety of electronic components, such as charge coupled device (CCD) or CMOS (complementary metal-oxide semiconductor) sensor, are suitable for portable devices and play an important role in integration. How to effectively package photosensitive chips used in these electronic components and improve the yield of the packaging technology has become an important issue to be addressed in the packaging industry.

Conventionally, to package a photosensitive chip, it should be considered that the chip requires direct irradiation or receipt of light and must be isolated from dust or moisture that may damage the performance of the chip. U.S. Pat. No. 6,384,472 discloses a photosensitive semiconductor package. As shown in FIG. 7, this semiconductor package comprises a conventional lead frame 60 having a die pad 61 and a plurality of leads 62. An encapsulant 65 is formed on the lead frame 60 and shaped as a dam to define a chip receiving cavity. Then, a photosensitive chip 63 is mounted on the die pad 61 and received in the chip receiving cavity. A plurality of bonding wires 64 are used to electrically connect the chip 63 to the leads 62. Finally, a light-penetrable material 66 such as optical glass is provided on the dam and serves as a lid to seal the chip receiving cavity. The light-penetrable material 66 can isolate the chip 63 from the external dust or moisture and allows light to penetrate it to reach the chip 63. This arrangement does not require high cost.

The above semiconductor package further comprises a recessed structure 67 respectively formed at the lower edges of the die pad 61 and at the inner ends of the leads 62 so as to increase the contact area and bondability between the encapsulant 65 and the lead frame 60. However, in the practical fabrication processes, after performing the subsequent high-temperature reliability or shock test or even long-distance transport, the increased contact area between the lead frame 60 and the encapsulant 65 provided by the recessed structures 67 may not be sufficient to secure firm bonding between the lead frame 60 and the encapsulant 65, and the encapsulant 65 is only attached to the peripheral sides of the die pad 61, thereby resulting in cracks or delamination between these components. This would undesirably cause moisture or dust to enter the semiconductor package and damage an active surface of the photosensitive chip 63, and thus seriously degrades the yield.

Accordingly, U.S. Pat. No. 6,545,332 discloses an improved semiconductor package. As shown in FIG. 8, in this semiconductor package, a layer of liquid adhesive compound 71 is applied on the die pad and the leads of the lead frame shown in FIG. 7 and covers the peripheral sides of the photosensitive chip 72 and part of the bonding wires 73. The adhesive compound 71 can be a resin. The adhesive compound 71 is applied in an amount not having a height exceeding the active surface of the chip 72. This allows the adhesive compound 71 after being cured to strengthen the die pad 74 and position the bonding wires 73, thereby improving the overall mechanical strength of the package. However, this arrangement does not solve the foregoing problem of insufficient bondability between die pad 74 and the encapsulant 75 such that cracks or delamination therebetween may still be incurred. Moreover, compared to the conventional package shown in FIG. 7, the arrangement of FIG. 8 requires an additional step of applying the liquid adhesive compound 71, which would lead to an increase in the fabrication processes and material cost. Furthermore, although the liquid adhesive compound 71 is primarily used to fix the bonding wires 73 in place, since there is a large difference in coefficient of thermal expansion (CTE) between the adhesive compound 71 and the bonding wires 73 such as gold wires, it is highly likely to cause breakage of the bonding wires 73 in a high-temperature test due to this CTE mismatch and undesirably degrade the yield.

Therefore, the problem to be solved here is to provide an improved photosensitive semiconductor package and a method of fabricating the same, which can increase the bondability between a die pad and an encapsulant to prevent cracks or delamination therebetween, and would not cause an increase in fabrication cost or breakage of bonding wires in the semiconductor package.

SUMMARY OF THE INVENTION

In light of the prior-art drawbacks, a primary objective of the present invention is to provide a photosensitive semiconductor package, a method for fabricating the same, and a lead frame thereof, which can increase mechanical strength of the semiconductor package.

Another objective of the present invention is to provide a photosensitive semiconductor package, a method for fabricating the same, and a lead frame thereof, which can increase bondability between a die pad and an encapsulant.

Still another objective of the present invention is to provide a photosensitive semiconductor package, a method for fabricating the same, and a lead frame thereof, without leading to cracks or delamination at interfaces between components made of different materials in the semiconductor package.

A further objective of the present invention is to provide a photosensitive semiconductor package, a method for fabricating the same, and a lead frame thereof, wherein the semiconductor package is fabricated by simple processes and with low cost A further objective of the present invention is to provide a photosensitive semiconductor package, a method for fabricating the same, and a lead frame thereof, without causing breakage of bonding wires.

In order to achieve the foregoing and other objectives, the present invention proposes a photosensitive semiconductor package comprising: a lead frame having a die pad and a plurality of leads, wherein each of the leads is formed with at least one recessed portion at an end thereof close to the die pad, and the die pad is formed with at least one recessed region thereon; an encapsulant for filling the recessed region of the die pad, the recessed portions of the leads and between the die pad and the leads, and formed on the lead frame to define a chip receiving cavity; a photosensitive chip having an active surface and a non-active surface and accommodated in the chip receiving cavity, wherein the non-active surface of the chip is mounted on the die pad, and at least partially the non-active surface is attached to the encapsulant filling the recessed region of the die pad and is free of contact with the recessed region; a plurality of bonding wires for electrically connecting the active surface of the chip to the plurality of leads; and a light-penetrable unit mounted on the encapsulant formed on the lead frame to seal the chip receiving cavity.

A method for fabricating above photosensitive semiconductor package in the present invention comprises the steps of: preparing a lead frame having a die pad and a plurality of leads; performing a half-etching or coining process to form at least one recessed portion at an end of each of the leads close to the die pad, and form at least one recessed region on the die pad; performing a molding process to fabricate an encapsulant, which fills the recessed region of the die pad, the recessed portions of the leads and between the die pad and the leads, and is formed on the lead frame to define a chip receiving cavity; mounting a photosensitive chip in the chip receiving cavity, the chip having an active surface and a non-active surface, wherein at least partially the non-active surface of the chip is attached to the encapsulant formed in the recessed region of the die pad and is free of contact with the recessed region; electrically connecting the active surface of the chip to the plurality of leads via a plurality of bonding wires; and mounting a light-penetrable unit on the encapsulant formed on the lead frame to seal the chip receiving cavity.

Moreover, the lead frame used in the photosensitive semiconductor package in the present invention comprises: a die pad having at least one recessed region; and a plurality of leads each formed with at least one recessed portion at an end thereof close to the die pad; wherein the recessed region of the die pad and the recessed portions of the leads are filled with an encapsulant in a molding process, such that when a chip is mounted on the die pad, at least partially a non-active surface of the chip is attached to the encapsulant filling the recessed region of the die pad and is free of contact with the recessed region.

The above recessed region can be formed by a half-etching or coining technique, and is located at a central position or a peripheral position of the die pad. Moreover, the recessed region can be shaped as a polygon, a cross, or a circle. The die pad may be further formed with at least one opening region communicating with the recessed region, wherein the opening region comprises a plurality of openings or is a single square region.

The above chip is a photosensitive chip having a photosensitive area on an active surface thereof. The light-penetrable unit is a glass plate, an IR (infrared) filter, or a coating layer of a light-penetrable material.

Therefore, in the photosensitive semiconductor package, the method for fabricating the same and the lead frame thereof according to the present invention, at least one recessed region is formed on the die pad and filled with an encapsulant such that the die pad is encapsulated by the encapsulant, allowing at least partially a non-active surface of the chip mounted on the die pad to be attached to the encapsulant filling the recessed region of the die pad and not in contact with the recessed region. This can significantly improve the bondability between the encapsulant and the die pad and the mechanical strength of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1A:
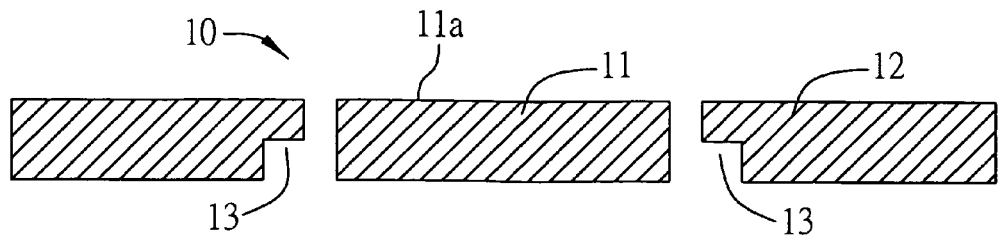
FIGS. 1A to 1H are schematic diagrams showing procedural steps of a method for fabricating a photosensitive semiconductor package according to a first preferred embodiment of the present invention.
Figure 1B:
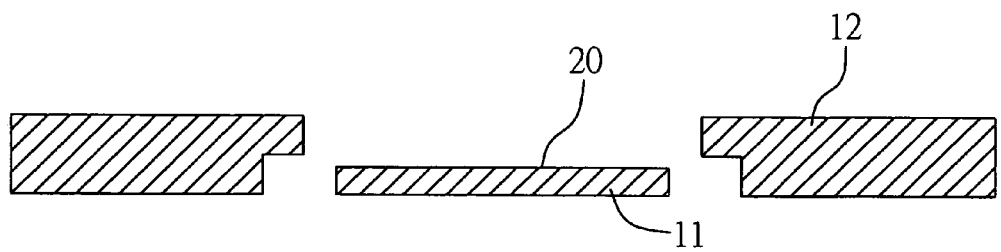
Figure 1C:
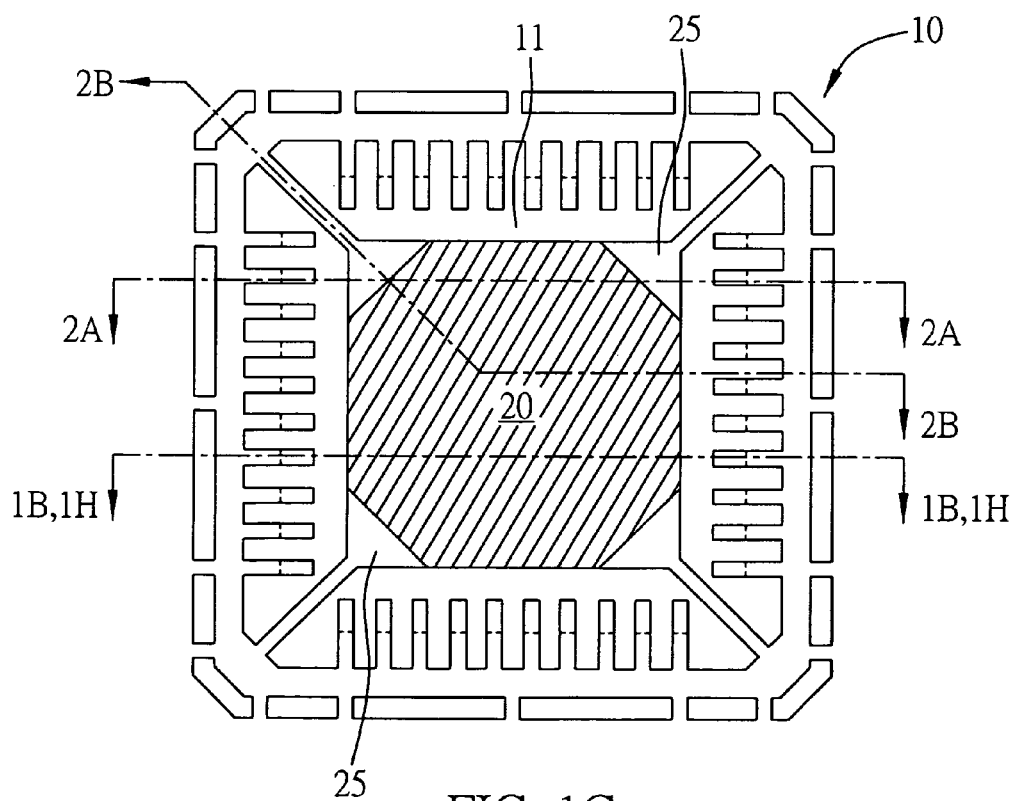
Figure 1D:
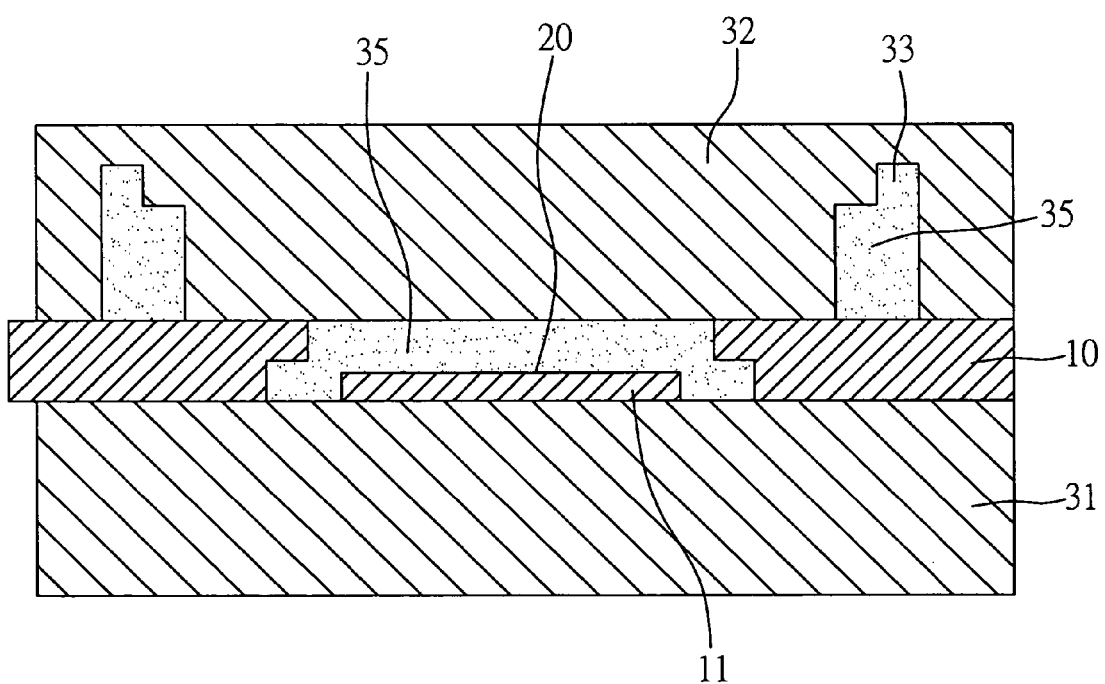
Figure 1E:
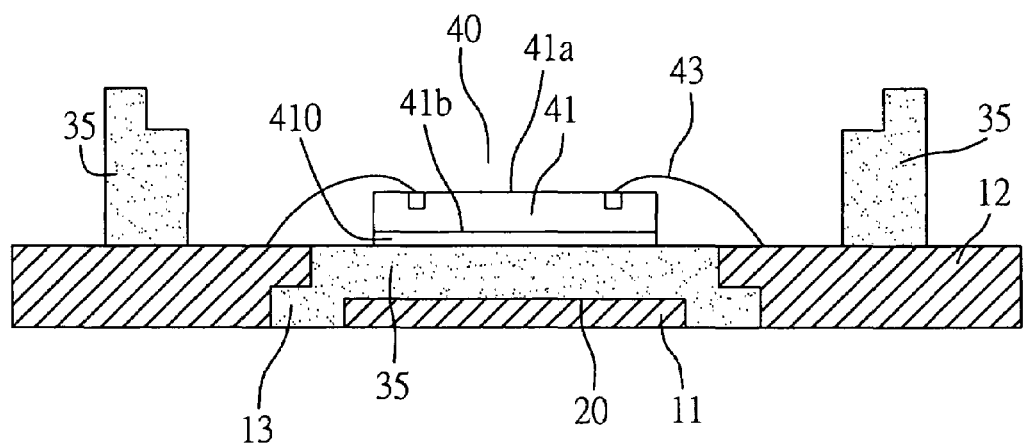
Figure 1F:
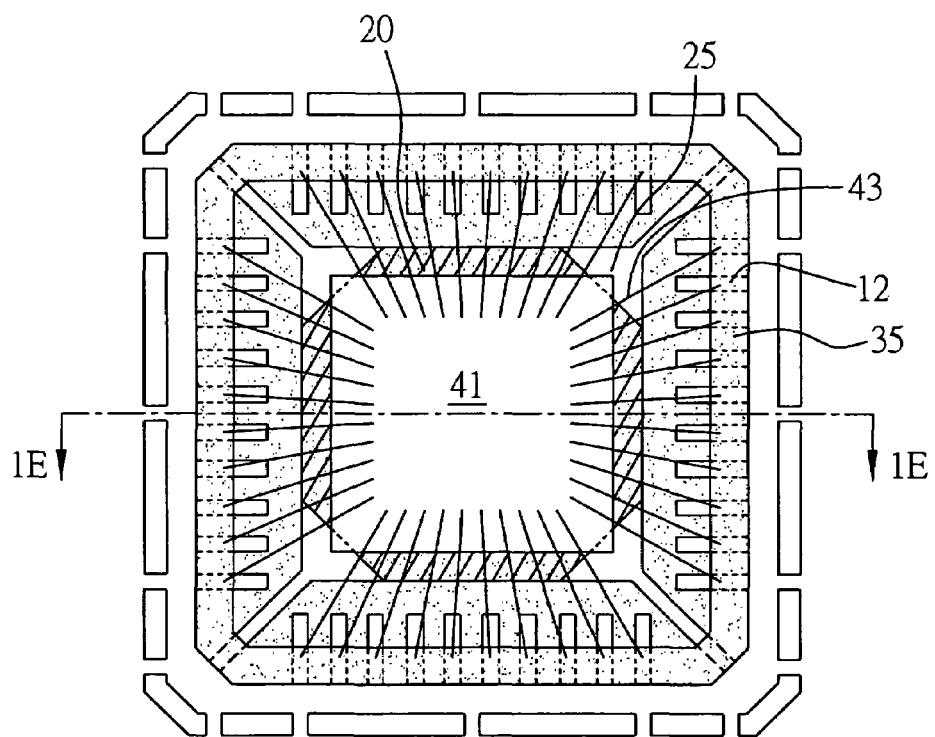
Figure 1G:
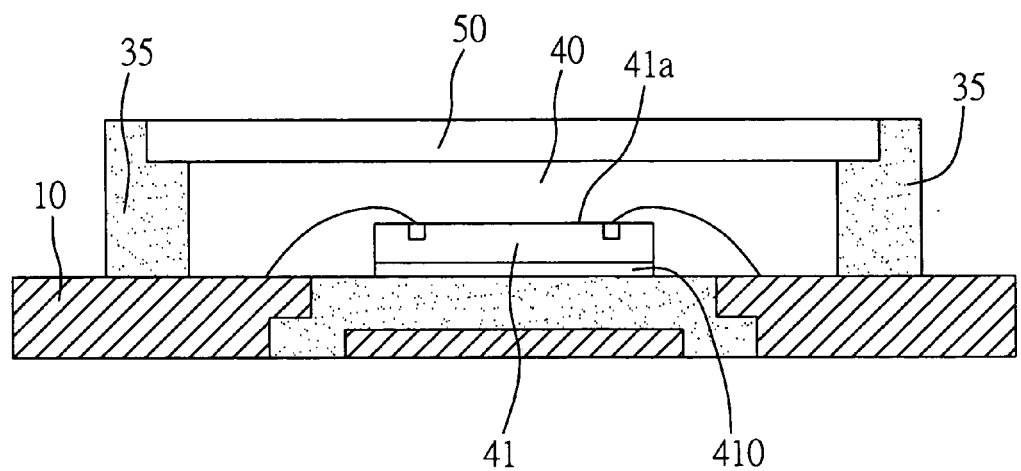

A photosensitive semiconductor package proposed in the present invention can be fabricated by the procedural steps shown in FIGS. 1A to 1H in accordance with a first preferred embodiment of the present invention. First, referring to FIG. 1A, a lead frame 10 having a die pad 11 and a plurality of leads 12 surrounding the die pad 11 is prepared. A half-etching process is performed to form at least one recessed portion 13 at an end of each of the leads 12 close to the die pad 11, such that the end of the lead 12 with the recessed portion 13 forms a stepped structure. Then, referring to FIG. 1B, the half-etching process is again carried out to form at least one recessed region 20 on a top surface 11a of the die pad 11. As shown in FIG. 1C, this recessed region 20 can be shaped as a octagonal recess located at a central position of the die pad 11, and the recessed region 20 is made by etching to be close to edges of the die pad, with substantially four triangular non-recessed regions 25 being left at corner positions on the die pad 11; Subsequently, referring to FIG. 1D, a molding process is performed in which a lower mold 31 is flush with a bottom surface of the lead frame 10 and an upper mold 32 has a molding cavity 33 to allow an encapsulant 35 to fill therein. After completing the molding process and removing the molds 31, 32, as shown in FIG. 1E, the encapsulant 35 is formed on the lead frame 10 to define a chip receiving cavity 40 and fills the recessed region 20 of the die pad 11, the recessed portions 13 of the leads 12 and between the die pad 11 and the leads 12. Further referring to FIG. 1E and as shown in FIG. 1F, a photosensitive chip 41 is mounted in the chip receiving cavity 40, wherein a non-active surface 41b of the chip 41 is attached to the encapsulant 35 filling the recessed region 20 of the die pad 11 by an adhesive 410 and is not in contact with the recessed region 20. Then, a plurality of bonding wires 43 are formed to electrically connect an active surface 41a of the chip 41 to the corresponding leads 12. Referring to FIG. 1G, a light-penetrable unit 50 is mounted on the encapsulant 35 formed on the lead frame 10 to seal the chip receiving cavity 40 and spaced apart from a photosensitive area (not shown) formed on the active surface 41a of the chip 41. The light-penetrable unit 50 can isolate the chip 40 from external dust and provide a light penetrable effect. Finally referring to FIG. 1H, a cutting process is performed to remove unnecessary parts of the leads 12, such that the photosensitive semiconductor package in the present invention is completely fabricated.

The provision of the above recessed region 20 on the die pad 11 can effectively increase a contact area between the die pad 11 and the encapsulant 35, thereby solving the problem of cracking or delamination between a die pad and an encapsulant due to insufficient bondability in the prior art. As shown in FIGS. 1C and 1H and FIGS. 2A and 2B using the lead frame 10 shown in FIG. 1C, the octagonal recessed region 20 of the die pad 11 allows the contact area between the encapsulant 35 and the die pad 11 to be increased at least by eight peripheral sides and a bottom surface of the octagonal recessed region 20, thereby enhancing the bondability between the die pad 11 and the encapsulant 35. Moreover, provision of the recessed portions 13 of the leads 12 also increases the bondability between the encapsulant 35 and the lead frame 10. As a result, the mechanical strength of the semiconductor package is improved without causing cracks or delamination at interfaces between components made of different materials therein. In comparison with the prior art, the present invention does not lead to an increase in the overall fabrication cost and breakage of bonding wires 43, thereby solving the prior-art problem of reducing the yield.

Figure 1H:
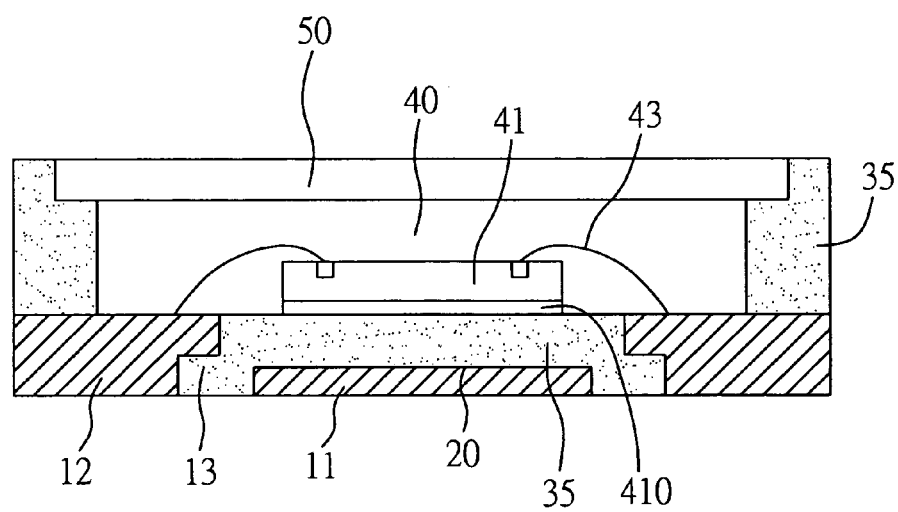
Figure 2A:
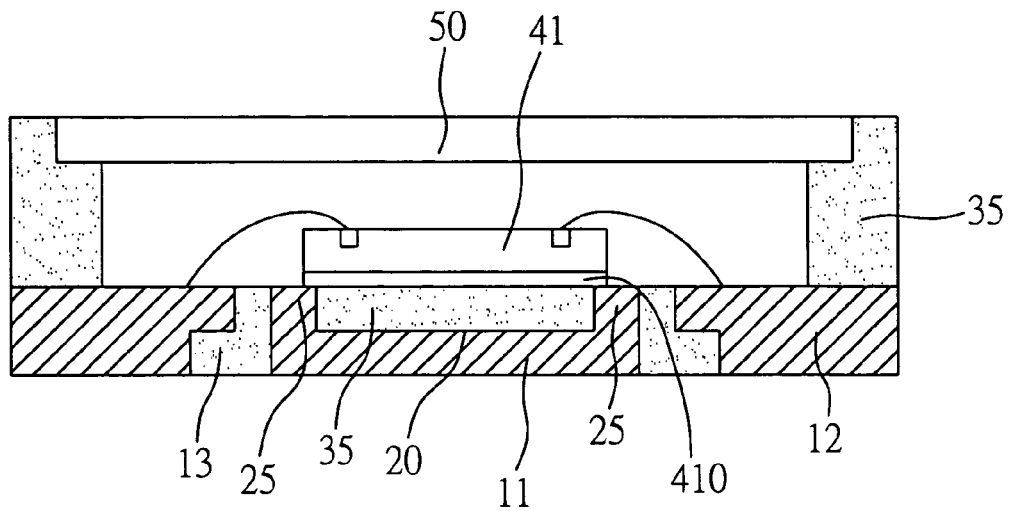
FIGS. 2A and 2B are cross-sectional views of the photosensitive semiconductor package having a lead frame shown in FIG. 1C taken along lines 2A—2A and 2B—2B respectively.
Figure 2B:
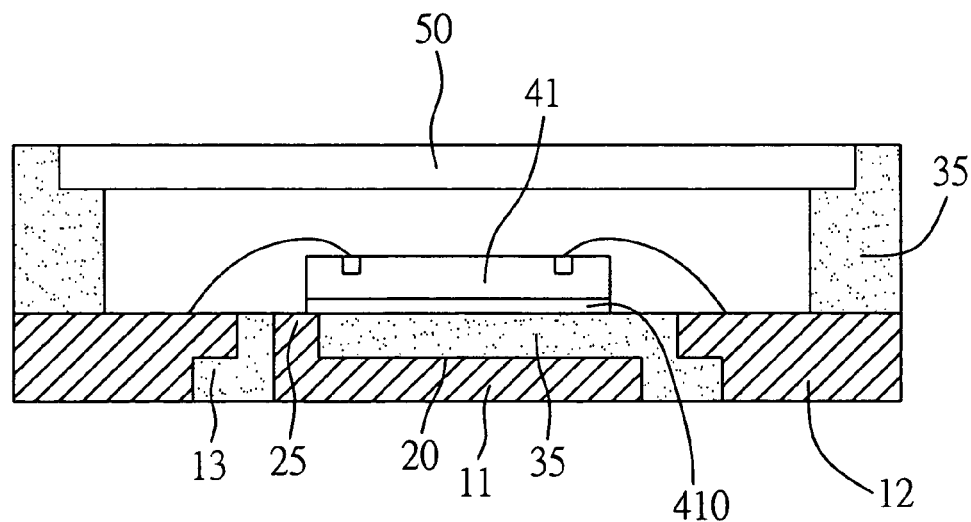

Accordingly, as shown in FIGS. 1H, 2A and 2B, the photosensitive semiconductor package in the present invention comprises a lead frame 10 having a die pad 11 and a plurality of leads 12, wherein at least one recessed portion 13 is formed at an end of each of the leads 12 close to the die pad 11, and at least one octagonal recessed region 20 is formed on a top surface 11a of the die pad 11 by a half-etching technique and extended to be close to edges of the die pad 11, with substantially four triangular non-recessed regions 25 being left at corner positions on the die pad 11; an encapsulant 35 for filling on the recessed portions 13 of the leads 12, the recessed region 20 of the die pad 11, and between the leads 12 and the die pad 11, and formed on the lead frame 10 to define a chip receiving cavity 40; a photosensitive chip 41 mounted in the chip receiving cavity 40 and attached via its non-active surface 41b to the encapsulant 35 filling the recessed region 20 of the die pad 11 by an adhesive 410; a plurality of bonding wires 43 formed in the chip receiving cavity 40, for electrically connecting an active surface 41a of the chip 41 to the leads 12; and a light-penetrable unit 50 such as a glass plate attached to the encapsulant 35 formed on the lead frame 10 to seal the chip receiving cavity 40 and spaced apart from the active surface 41a of the chip 41.

Besides the half-etching method, the foregoing recessed region 20 on the die pad 11 can also be formed by a coining technique or other suitable conventional removing processes. Besides the glass plate, the light-penetrable unit 50 can also be made of other light-penetrable materials such as an IR (infrared) filter or a coating layer of a liquid light-penetrable material.

Second Preferred Embodiment

Figure 3A:
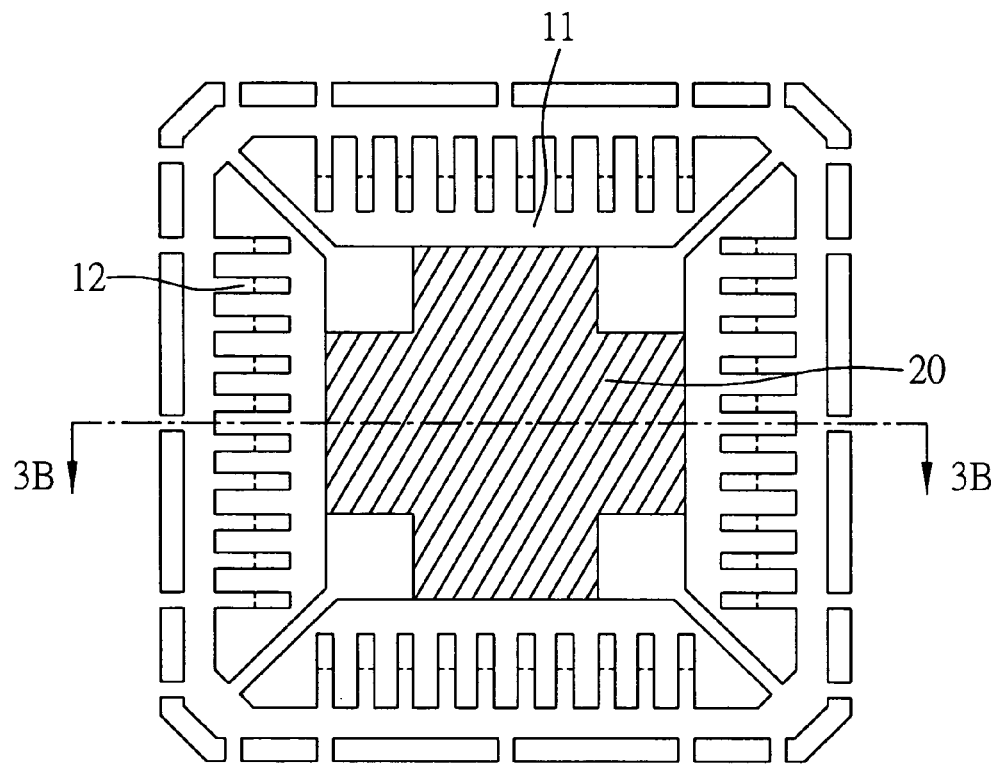
FIG. 3A is a top view of the lead frame according to a second preferred embodiment of the present invention.
Figure 3B:
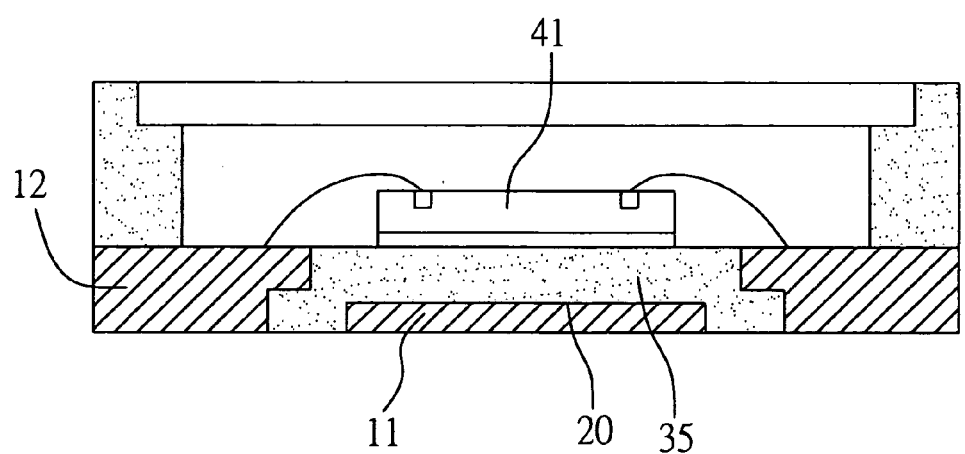
FIG. 3B is a cross-sectional view of the photosensitive semiconductor package according to the second preferred embodiment of the present invention.

As shown in FIGS. 3A and 3B, this second embodiment differs from the above first embodiment in that the recessed region 20 is shaped as a cross at a central position of the die pad 11 and extended to be close to the edges of the die pad 11. The chip 41 is similarly attached to the encapsulant 35 formed on the cross-shaped recessed region 20 and not in contact with the recessed region 20. Provision of the cross-shaped recessed region 20 desirably increases the contact area and bondability between the die pad 11 and the encapsulant 35, thereby improving the mechanical strength of the overall package structure. Thus, it should be understood that the shape of the recessed region 20 is not particularly limited in the present invention, and the recessed region can be flexibly shaped as a circle or a polygon. In general, the more the sides of the recessed region, the larger the contact area between the die pad 11 and the encapsulant 35 is increased and the higher the bondability therebetween can be achieved.

Third Preferred Embodiment

Figure 4A:
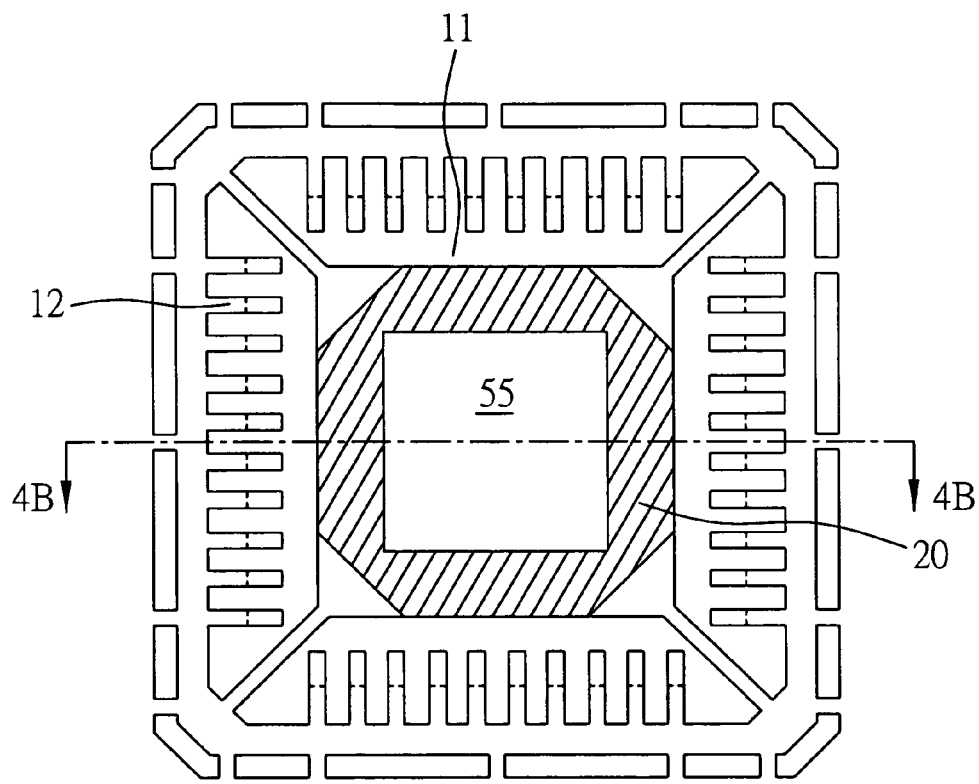
FIG. 4A is a top view of the lead frame according to a third preferred embodiment of the present invention.
Figure 4B:
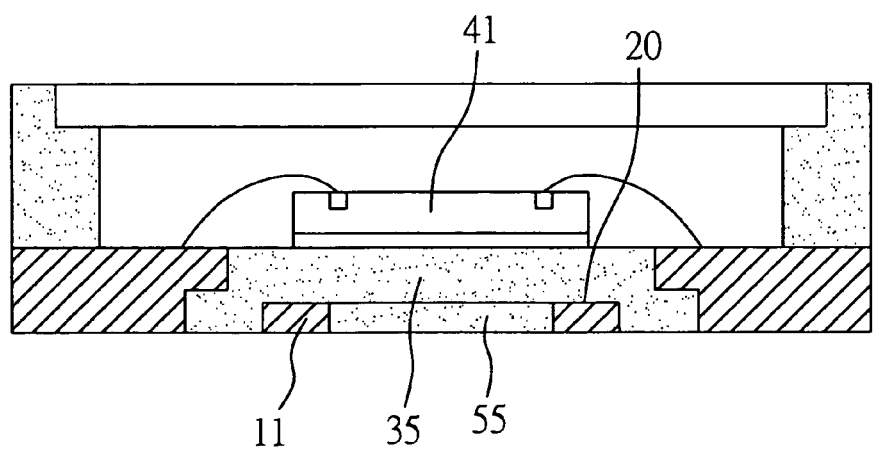
FIG. 4B is a cross-sectional view of the photosensitive semiconductor package according to the third preferred embodiment of the present invention.

In order to maximize the effect of increasing bondability in the present invention, as shown in FIGS. 4A and 4B, at least one opening region 55 can be formed in the die pad 11 and communicates with the recessed region 20 in this third embodiment. Specifically, a square opening region 55 can be formed by a half-etching or coining technique at a position corresponding to the center of the octagonal recessed region 20. The opening region 55 is filled with the encapsulant 35, which thus further increases the contact area between the encapsulant 35 and the die pad 11 and further improves the bondability and mechanical strength of the semiconductor package.

Fourth Preferred Embodiment

Figure 5A:
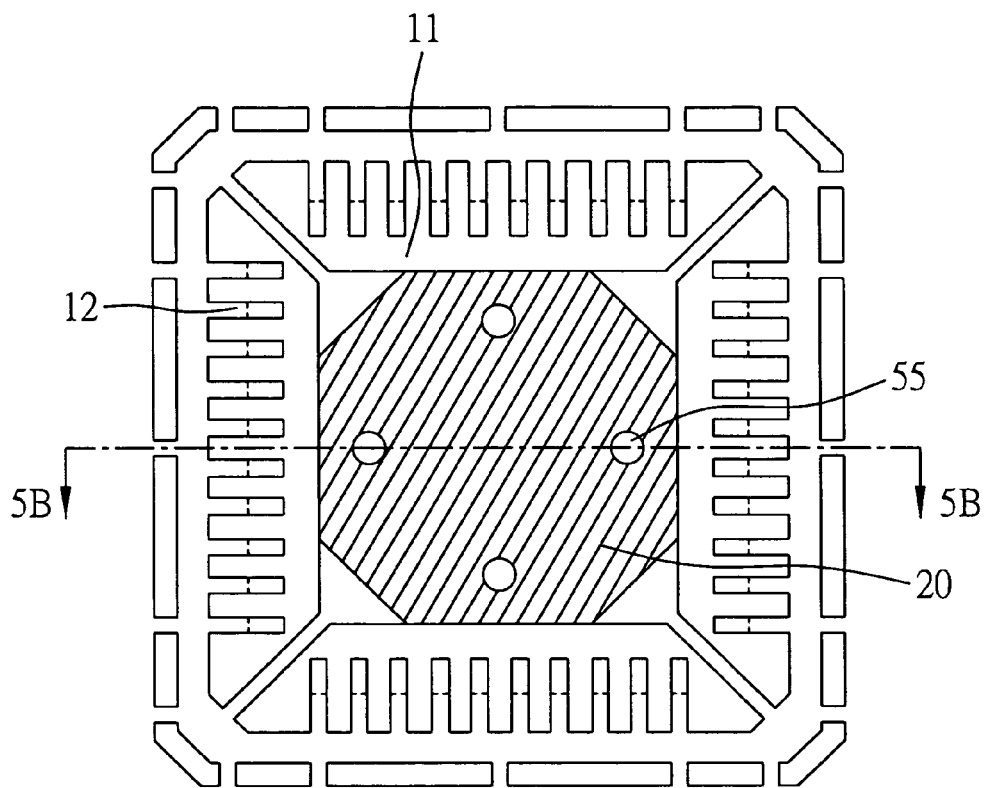
FIG. 5A is a top view of the lead frame according to a fourth preferred embodiment of the present invention.
Figure 5B:
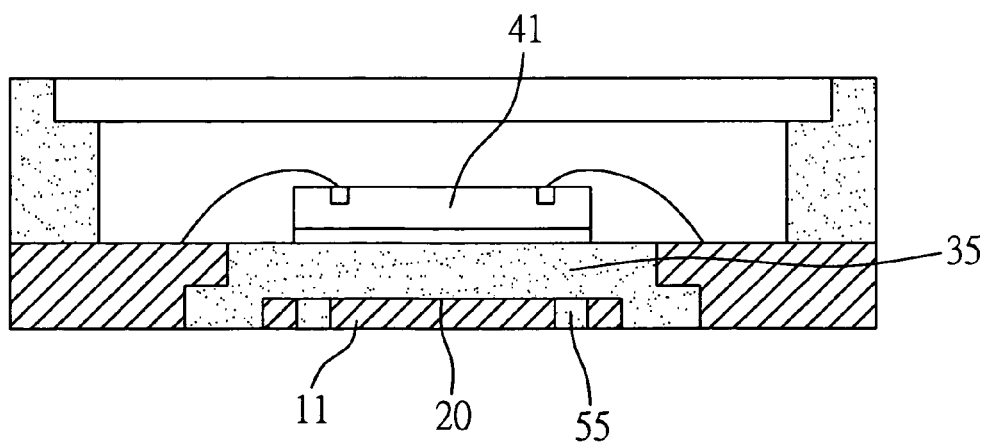
FIG. 5B is a cross-sectional view of the photosensitive semiconductor package according to the fourth preferred embodiment of the present invention.

The foregoing opening region is not limited to a single square region. Alternatively, as shown in FIGS. 5A and 5B, the opening region 55 in this fourth embodiment comprises four openings 55 (designated with the same reference numeral as the opening region), and each of the openings 55 is filled with the encapsulant 35 so as to further increase the bondability between the die pad 11 and the encapsulant 35 and the mechanical strength of the semiconductor package.

Fifth Preferred Embodiment

Figure 6A:
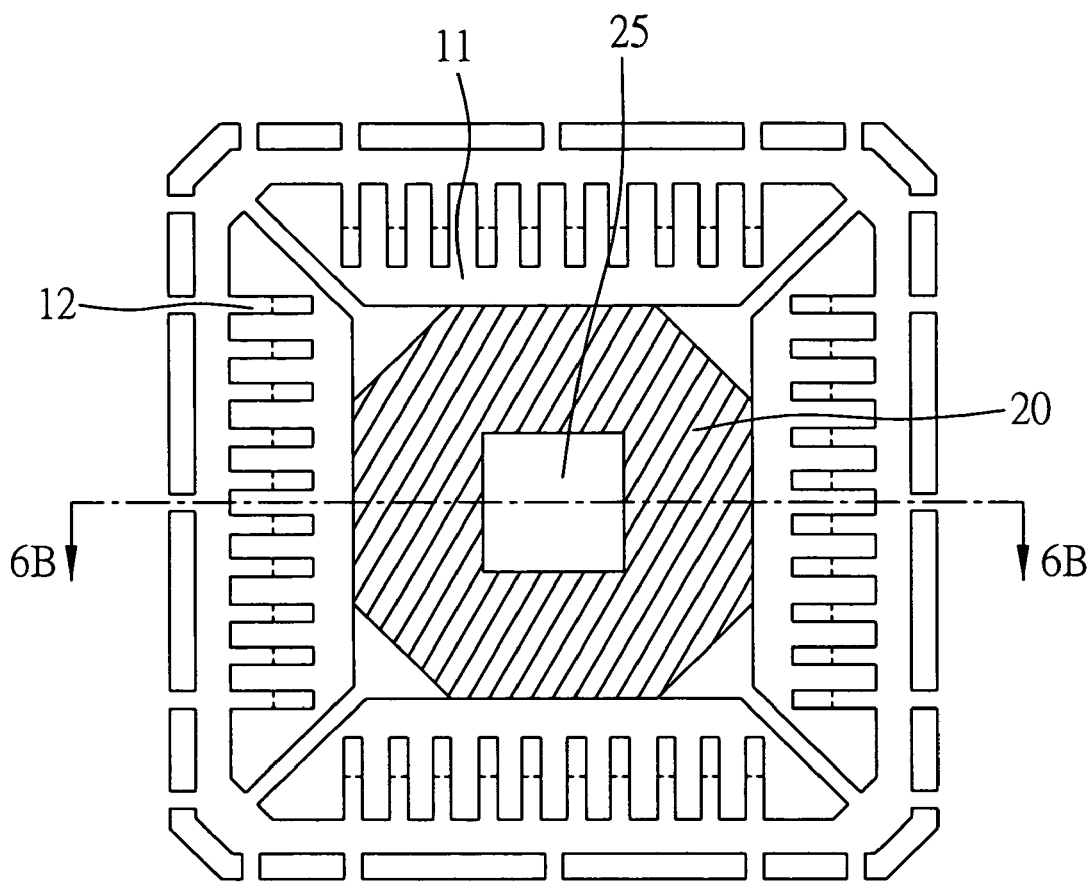
FIG. 6A is a top view of the lead frame according to a fifth preferred embodiment of the present invention.
Figure 6B:
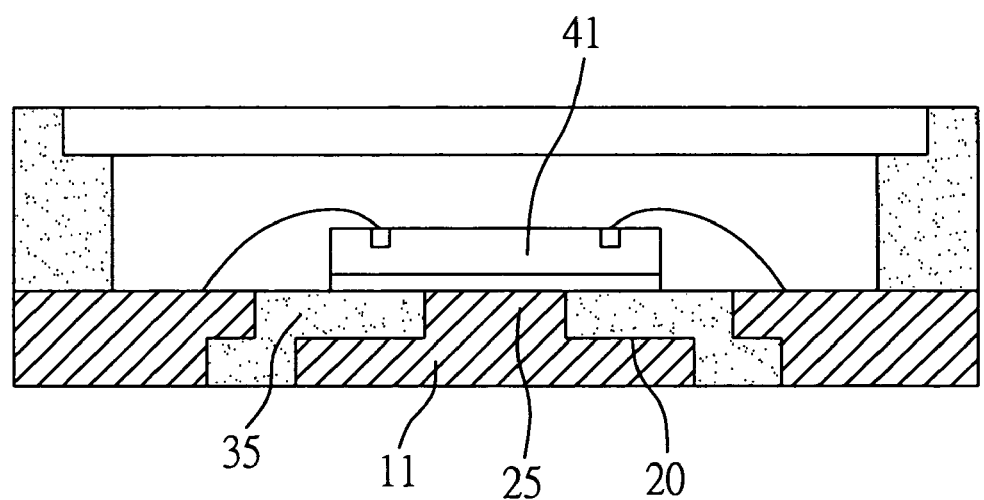
FIG. 6B is a cross-sectional view of the photosensitive semiconductor package according to the fifth preferred embodiment of the present invention.
Figure 7:
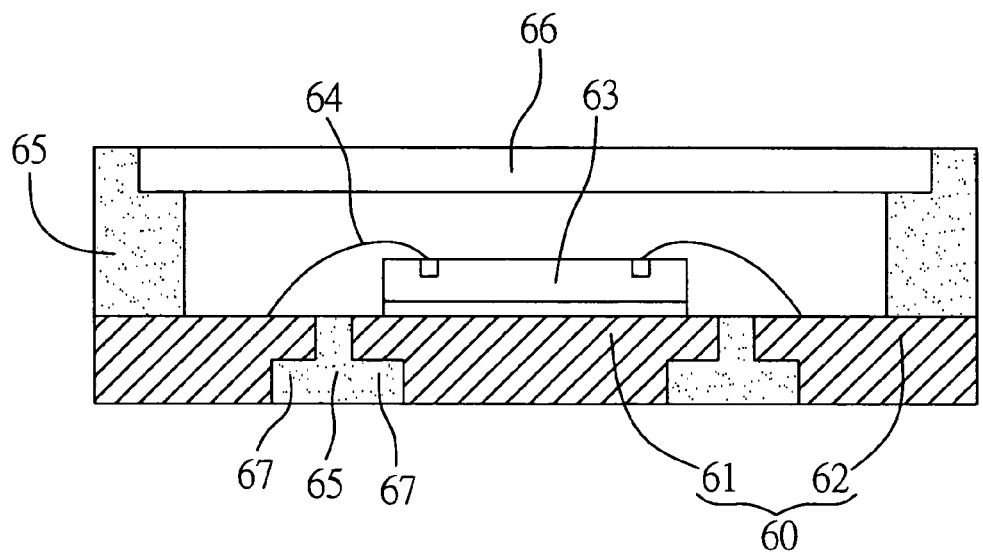
FIG. 7 (PRIOR ART) is a cross-sectional view of a semiconductor package disclosed in U.S. Pat. No. 6,384,472.
Figure 8:
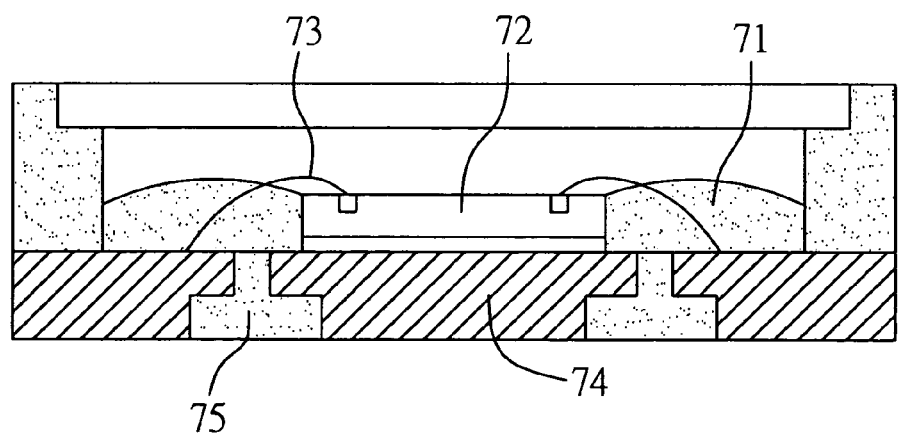
FIG. 8 (PRIOR ART) is a cross-sectional view of a semiconductor package disclosed in U.S. Pat. No. 6,545,332.

Apart from the recessed region in the above embodiments being formed at the central position of the die pad, in this fifth embodiment shown in FIGS. 6A and 6B, the recessed region 20 can be located at a peripheral position of the die pad 11. Specifically, the recessed region 20 is shaped as a octagonal ring on the peripheral area of the die pad 11, with a square non-recessed region 25 being left at the central area of the die pad 11 and surrounded by the recessed region 20. As a result, the chip 41 is partially mounted on the non-recessed region 25 and partially attached to the encapsulant 35 filling the surrounding octagonal recessed region 20, wherein the encapsulant 35 is also bonded to peripheral sides of the central non-recessed region 25, such that the bondability between the die pad 11 and the encapsulant 35 can be further improved.

Therefore, in the present invention, at least one recessed region 20 is formed on the die pad 11 to allow the encapsulant 35 to fill between the recessed region 20 and the chip 41, such that at least partially the non-active surface 41b of the chip 41 is attached to the encapsulant 35 formed on the recessed region 20 and not in contact with the recessed region 20. This arrangement increases the contact area and bondability between the encapsulant 35 and the die pad 11, thereby improving the mechanical strength of the semiconductor package. Thus, compared to the semiconductor package in prior art with a chip being directly mounted via its non-active surface on a die pad, the present invention with provision of the recessed region 20 can effectively solve the problems in the prior art and achieve the benefits of low fabrication cost and less breakage of bonding wires.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A photosensitive semiconductor package comprising:
   a lead frame having a die pad and a plurality of leads, wherein each of the leads is formed with at least one recessed portion at an end thereof close to the die pad, and the die pad is formed with at least one recessed region formed on a top surface of the die pad;
   an encapsulant for filling the recessed region of the die pad, the recessed portions of the leads and between the die pad and the leads, and formed on the lead frame to define a chip receiving cavity;
   a photosensitive chip having an active surface and a non-active surface and accommodated in the chip receiving cavity, wherein the non-active surface of the chip is mounted on corners of the die pad, and at least partially the non-active surface is attached to the encapsulant filling the recessed region of the die pad and is free of contact with the recessed region;
   a plurality of bonding wires for electrically connecting the active surface of the chip to the plurality of leads; and
   a light-penetrable unit mounted on the encapsulant formed on the lead frame to seal the chip receiving cavity.

2. The photosensitive semiconductor package of claim 1, wherein the recessed region is a half-etched region or a coining region.

3. The photosensitive semiconductor package of claim 1, wherein the non-active surface of the chip is completely located above the recessed region of the die pad and free of contact with the recessed region.

4. The photosensitive semiconductor package of claim 1, wherein the recessed region is formed at a central position or a peripheral position of the die pad.

5. The photosensitive semiconductor package of claim 1, wherein the recessed region is shaped as a polygon, a cross, or a circle.

6. The photosensitive semiconductor package of claim 1, wherein the die pad is further formed with at least one opening region communicating with the recessed region.

7. The photosensitive semiconductor package of claim 6, wherein the opening region comprises a plurality of openings.

8. The photosensitive semiconductor package of claim 1, wherein the light-penetrable unit is a glass plate, an IR (infrared) filter, or a coating layer of a light-penetrable material.

9. A lead frame comprising:
   a die pad having at least one recessed region formed on a top surface of the die pad; and
   a plurality of leads each formed with at least one recessed portion at an end thereof close to the die pad;
   wherein the recessed region of the die pad and the recessed portions of the leads are filled with an encapsulant in a molding process, such that when a chip is mounted on corners of the die pad, at least partially a non-active surface of the chip is attached to the encapsulant filling the recessed region of the die pad and is free of contact with the recessed region.

10. The lead frame of claim 9, wherein the recessed region is a half-etched region or a coining region.

11. The lead frame of claim 9, wherein the recessed region is formed at a central position or a peripheral position of the die pad.

12. The lead frame of claim 9, wherein the recessed region is shaped as a polygon, a cross, or a circle.

13. The lead frame of claim 9, wherein the die pad is further formed with at least one opening region communicating wit the recessed region.

14. The lead frame of claim 13, wherein the opening region comprises a plurality of openings.

* * * * *